United States Patent
Nelson

(10) Patent No.: US 10,423,016 B2
(45) Date of Patent: Sep. 24, 2019

(54) DRIVER FOR OPTICAL MODULATOR

(71) Applicant: ROCKLEY PHOTONICS LIMITED, London (GB)

(72) Inventor: David Arlo Nelson, Fort Collins, CO (US)

(73) Assignee: Rockley Photonics Limited, London (GB)

( * ) Notice: Subject to any disclaimer, the term of this patent is extended or adjusted under 35 U.S.C. 154(b) by 0 days.

(21) Appl. No.: 15/982,928

(22) Filed: May 17, 2018

(65) Prior Publication Data

US 2018/0341125 A1 Nov. 29, 2018

Related U.S. Application Data

(60) Provisional application No. 62/510,211, filed on May 23, 2017.

(51) Int. Cl.
| | |
|---|---|
| G02B 26/00 | (2006.01) |
| G02F 1/00 | (2006.01) |
| G02F 1/03 | (2006.01) |
| G02F 1/07 | (2006.01) |
| G02F 1/01 | (2006.01) |
| G02F 1/17 | (2019.01) |
| H03K 17/687 | (2006.01) |
| H04B 10/50 | (2013.01) |
| H04B 10/588 | (2013.01) |

(Continued)

(52) U.S. Cl.
CPC ............ *G02F 1/0121* (2013.01); *G02F 1/17* (2013.01); *H03F 1/3241* (2013.01); *H03F 3/217* (2013.01); *H03F 3/245* (2013.01); *H03K 17/687* (2013.01); *H04B 10/505* (2013.01); *H04B 10/588* (2013.01); *H03K 19/20* (2013.01)

(58) Field of Classification Search
USPC ............... 359/237, 242–245, 250–252, 254, 359/265–267, 270–273, 290–292, 295, 359/298
See application file for complete search history.

(56) References Cited

U.S. PATENT DOCUMENTS

| | | |
|---|---|---|
| 6,707,589 B2 | 3/2004 | Bostak et al. |
| 9,136,948 B2 | 9/2015 | Hauenschild et al. |

(Continued)

FOREIGN PATENT DOCUMENTS

| | | |
|---|---|---|
| EP | 0 681 199 A2 | 11/1995 |
| WO | WO 2017/074366 A1 | 5/2017 |

OTHER PUBLICATIONS

International Search Report and Written Opinion of the International Searching Authority, dated Sep. 10, 2018, Corresponding to PCT/EP2018/063492, 13 pages.

*Primary Examiner* — Brandi N Thomas
(74) *Attorney, Agent, or Firm* — Lewis Roca Rothgerber Christie LLP

(57) ABSTRACT

A modulator drive circuit, including: a first transistor having: a first output terminal connected to a first reference voltage, a second output terminal connected to a first output terminal of the modulator drive circuit, and a control terminal; and a second transistor having: a first output terminal connected to a second reference voltage different from the first reference voltage, a second output terminal connected to the first output terminal of the modulator drive circuit, and a control terminal.

11 Claims, 3 Drawing Sheets

(51) Int. Cl.
*H03F 3/217* (2006.01)
*H03F 1/32* (2006.01)
*H03F 3/24* (2006.01)
*H03K 19/20* (2006.01)

(56) References Cited

U.S. PATENT DOCUMENTS

2011/0019380 A1* 1/2011 Miles ................. G02B 26/0841
                                                    361/783
2015/0263812 A1   9/2015 Tatsumi
2016/0070123 A1   3/2016 Tatsumi

* cited by examiner

FIG. 1 – RELATED ART

DRIVER FOR OPTICAL MODULATOR

CROSS-REFERENCE TO RELATED APPLICATION(S)

The present application claims priority to and the benefit of U.S. Provisional Application No. 62/510,211, filed May 23, 2017, entitled "DRIVER FOR OPTICAL MODULATOR", the entire content of which is incorporated herein by reference.

FIELD

One or more aspects of embodiments according to the present invention relate to modulation of light, and more particularly to a driver for an optical modulator.

BACKGROUND

A related art PAM-4 driver for an electro-absorption modulator (or "EA modulator", or "EAM", or simply "EA") may consist of a digital to analog converter (DAC) and linear amplifier, as shown, for example, in FIG. 1. Highly nonlinear devices like EA modulators (40% THD typical) can be linearized with predistortion using a 2 bit to 6 bit lookup table and high speed DAC to drive a linear amplifier. To keep power dissipation low, the lookup table and DAC may be integrated in CMOS, but to provide sufficient drive amplitude the linear amplifier may be a biCMOS or InP circuit. Such implementations may consume 500 mW-1000 mW of power. Everything could be integrated in biCMOS, but the power dissipation, if this were done, would be much larger. Implementation of this architecture in CMOS is impractical for high data rates such as 56 Gbps, because CMOS circuits capable of operating at this speed can only support Vds and Vgs of 1 V or less. EA's require 2 V drive for good performance. And obtaining linearity in CMOS is difficult without large devices to generate high transconductance, but this leads to devices with high parasitic capacitance, which limits the bandwidth.

Thus, there is a need for an improved driver for an optical modulator.

SUMMARY

According to an embodiment of the present disclosure there is provided a modulator drive circuit, including: a first transistor having: a first output terminal connected to a first reference voltage, a second output terminal connected to a first output terminal of the modulator drive circuit, and a control terminal; and a second transistor having: a first output terminal connected to a second reference voltage different from the first reference voltage, a second output terminal connected to the first output terminal of the modulator drive circuit, and a control terminal.

According to an embodiment of the present disclosure there is provided a modulator drive circuit, including: a first plurality of transistors; a second plurality of transistors; and a transistor drive circuit, each of the first plurality of transistors having: a first output terminal connected to a respective reference voltage, a second output terminal connected to a first output terminal of the modulator drive circuit, and a control terminal connected to the transistor drive circuit; each of the second plurality of transistors having: a first output terminal connected to a respective reference voltage, a second output terminal connected to a second output terminal of the modulator drive circuit, and a control terminal connected to the transistor drive circuit; the transistor drive circuit being configured to operate at any time in one of a plurality of states, and, in any state of the plurality of states: to turn on: one of the first plurality of transistors, and one of the second plurality of transistors; and to turn off: the remainder of the transistors of the first plurality of transistors, and the remainder of the transistors of the second plurality of transistors.

In one embodiment, the modulator includes a helper transistor having: a first output terminal connected to the first output terminal of a first transistor of the first plurality of transistors, a second output terminal connected to the second output terminal of the first transistor, and a control terminal connected to the transistor drive circuit, wherein the transistor drive circuit is further configured: in any state of the transistor drive circuit in which the first transistor is turned on, to turn on the helper transistor; and in any state of the transistor drive circuit in which the first transistor is turned off, to turn off the helper transistor.

In one embodiment, the helper transistor has a polarity opposite to that of the first transistor.

In one embodiment, the first plurality of transistors includes four transistors, the second plurality of transistors includes four transistors, and the modulator drive circuit is configured to effect PAM-4 modulation with an electro-absorption modulator.

In one embodiment, each of the first plurality of transistors is a metal oxide semiconductor field effect transistor (MOSFET), and each of the second plurality of transistors is a MOSFET.

In one embodiment, the first output terminal of a first transistor of the first plurality of transistors is connected to a first reference voltage, the first output terminal of a second transistor of the first plurality of transistors is connected to a second reference voltage, greater than the first reference voltage, the first output terminal of a third transistor of the first plurality of transistors is connected to a third reference voltage, greater than the second reference voltage, the first output terminal of a fourth transistor of the first plurality of transistors is connected to a fourth reference voltage, greater than the third reference voltage, the first output terminal of a first transistor of the second plurality of transistors is connected to a fifth reference voltage, greater than or equal to the fourth reference voltage, the first output terminal of a second transistor of the second plurality of transistors is connected to a sixth reference voltage, greater than the fifth reference voltage, the first output terminal of a third transistor of the second plurality of transistors is connected to a seventh reference voltage, greater than the sixth reference voltage, the first output terminal of a fourth transistor of the second plurality of transistors is connected to an eighth reference voltage, greater than the seventh reference voltage.

In one embodiment, the modulator includes: the modulator drive circuit of claim 7, and an electro-absorption modulator connected to the first and second output terminals of the modulator drive circuit, wherein the fifth reference voltage exceeds the fourth reference voltage by at least 250 mV.

In one embodiment, the first transistor of the first plurality of transistors is an n-type MOSFET, the second transistor of the first plurality of transistors is an n-type MOSFET, the third transistor of the first plurality of transistors is a p-type MOSFET, the fourth transistor of the first plurality of transistors is a p-type MOSFET, the first transistor of the second plurality of transistors is an n-type MOSFET, the second transistor of the second plurality of transistors is an n-type MOSFET, the third transistor of the second plurality of transistors is a p-type MOSFET, and the fourth transistor of the second plurality of transistors is a p-type MOSFET.

In one embodiment, each of: the second reference voltage, the third reference voltage, the fourth reference voltage, the fifth reference voltage, the sixth reference voltage, the seventh reference voltage, and the eighth reference voltage, exceeds a respective one of: the first reference voltage, the second reference voltage, the third reference voltage, the fourth reference voltage, the fifth reference voltage, the sixth reference voltage, and the seventh reference voltage, by an amount greater than 0.2 V and less than 0.5 V.

In one embodiment, a transistor of the second plurality of transistors is in a deep n-well in an integrated circuit.

In one embodiment, the modulator includes an input configured to receive an input value consisting of two bits, wherein the modulator drive circuit is configured to produce an output voltage, between the first output terminal of the modulator drive circuit and the second output terminal of the modulator drive circuit, the output voltage being: a first voltage when the input value is 10, a second voltage, greater than the first voltage, when the input value is 11, a third voltage, greater than the second voltage, when the input value is 01, a fourth voltage, greater than the third voltage, when the input value is 00.

In one embodiment, the modulator includes a selection logic circuit for generating, based on the input value, control signals for the first plurality of transistors, the selection logic circuit including: an AND gate having two inputs, and an output; and a NOR gate having two inputs, and an output connected to the output of the AND gate.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a driver for an optical modulator provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1:
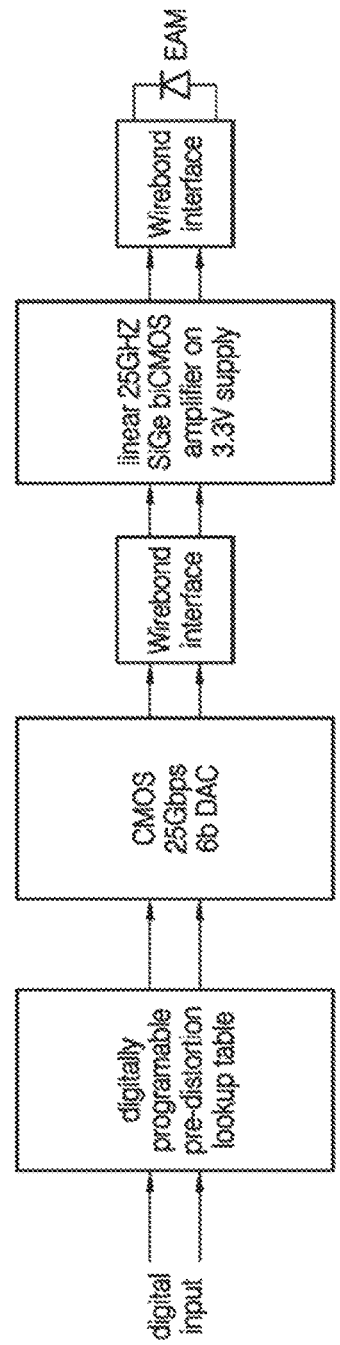
FIG. 1 is a block diagram of a driver and a modulator.
Figure 2:
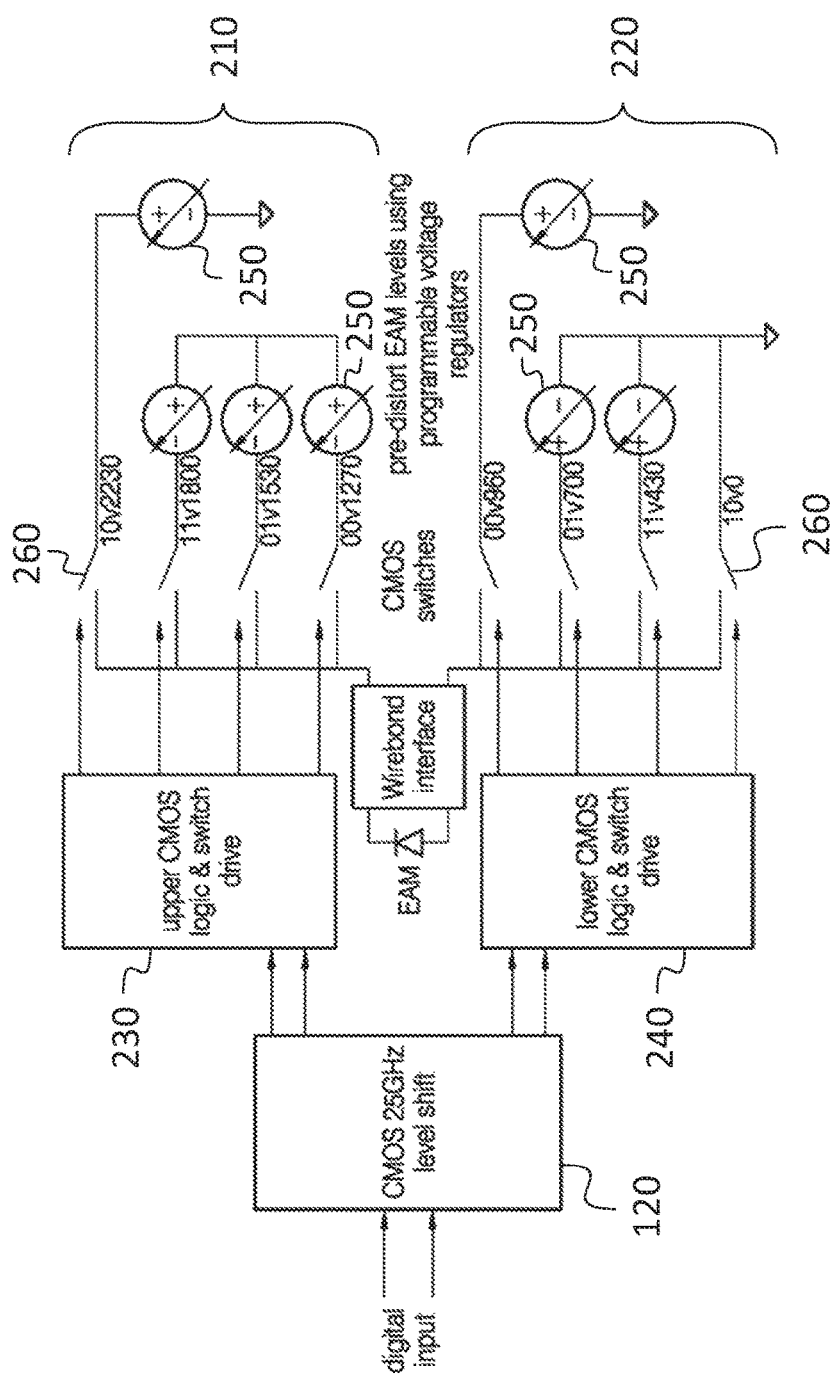
FIG. 2 is a block diagram of a driver and a modulator, according to an embodiment of the present invention.

Referring to FIG. 2, in some embodiments the high speed lookup table and DAC are replaced with programmable voltage sources 250. And the linear amplifier is replaced with high speed digitally controlled CMOS switches 260. The digital input signal, consisting of the binary MSB and LSB of a 2 bit digital input, are level shifted by the CMOS, 25 GHz bandwidth, level shift circuit 120. This high speed digital input is used to control switches 260, and accordingly does not need to be pre-distorted or drive a lookup table. The upper level CMOS circuitry 210 is placed inside a deep n-well and powered by approximately 2.23 V and 1.27 V supply voltages in this example, which keeps the maximum Vds and Vgs of any transistor to a safe level of 2.23 V−1.27 V=960 mV. The lower level CMOS circuitry 220 is powered from 960 mV and 0 V with or without use of deep n-wells. In some embodiments all circuits sharing a common supply voltage are within a respective deep n-well. Each of the logic and switch drive circuits 230, 240 is powered from the same respective pairs of supply voltage, e.g., (i) 1.27 V and 2.23 V, and (ii) 0 V and 960 mV, respectively. Each of the logic and switch drive circuits 230, 240 receives, from the level shift circuit 120, a 2-bit input encoded as Gray code, with the four consecutive Gray code values 00, 01, 11, and 10 each corresponding to a respective one of the four attenuation levels of the EA (or "PAM-4 states") when operated to generate PAM-4 modulation. In some embodiments the 2-bit input is encoded in another manner, e.g., in binary code.

The respective voltages produced, in one embodiment, by the programmable voltage sources 250 are shown, in FIG. 2; for example, for one of the programmable voltage sources 250, the voltage produced is designated with the notation 11v1800. The first two digits (i.e., the two digits preceding the "v") represent the Gray code logic level corresponding to the PAM-4 state in which the respective voltage is applied to the modulator, in binary format, while the digits following the "v" designate the voltage in millivolts (mV) that may be a typical value for the predistorted voltage applied to one terminal of the EA in the PAM-4 state. There is thus a pair of switches 260 for each digital value 00, 01, 11, and 10. When any one switch pair is on (low resistance), all others are turned off (high resistance). Switches 260 connected to 00v1270 and 00v960 are one such pair; 11v1800 and 11v430 are another pair, etc. The upper logic and switch drive circuit 230 and lower logic and switch drive circuit 240 act in concert to provide the predistorted voltage to linearize the EA. In the PAM-4 state corresponding to Gray code 00, the applied voltage for this example is 1270 mV−960 mV=310 mV. At Gray code 01, the applied voltage is 1530 mV−700 mV=830 mV. At Gray code 11 the applied voltage is 1800 mV−430 mV=1370 mV. At Gray code 10 the applied voltage is 2230 mV−0 mV=2230 mV. In some embodiments the changes in the voltage applied to the modulator, between the four PAM-4 levels are 0.52 V, 0.54 V, and 0.86 V as shown in FIG. 2. In other embodiments the ratio of the largest change to the smallest change (which is 1.65 in FIG. 2) is smaller or larger (e.g., this ratio may be in the range 1.1 to 3.0). The EA may be connected to the driver by wire bonds as shown in FIG. 2, or by other types of interconnects such as a flip chip/bump bond interconnect, or a redistribution layer (RDL) interconnect from chip scale wafer packaging, or the like.

Figure 3:
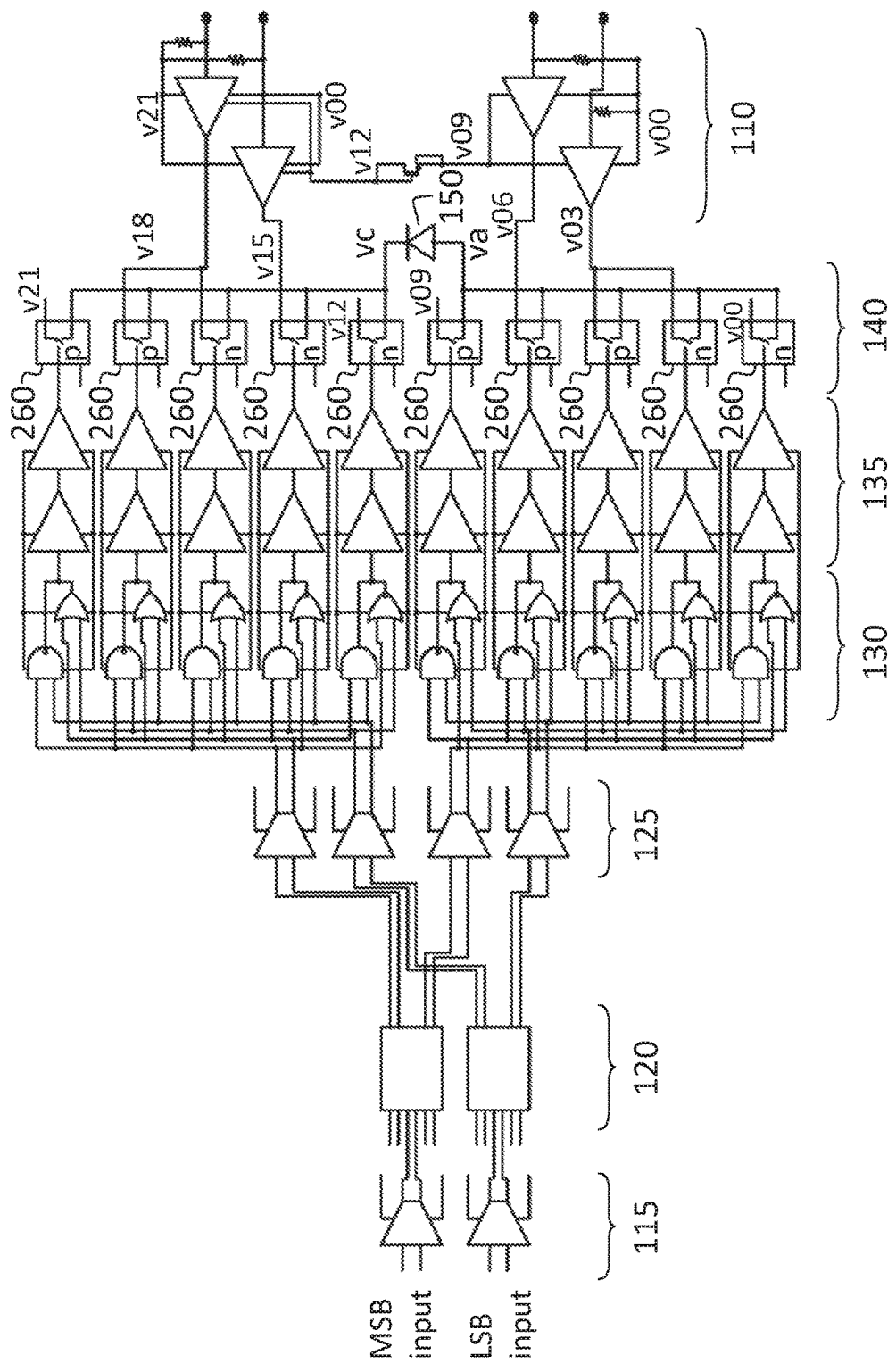
FIG. 3 is a schematic diagram of a driver and a modulator, according to an embodiment of the present invention.

The switches 260 may be sufficiently strong to charge and discharge parasitic capacitance within the EA within a fraction of the unit interval time for the data rate, such as 56 Gbps, as well as to provide the parasitic photodiode current generated by light being absorbed within the EA. In the PAM-4 state corresponding to Gray code 00, the applied voltage is set to ~300 mV to insure that with high optical input power to the EA (e.g., 10 mW of input power, or 1.0 mW-100.0 mW of input power), the parasitic photodiode current does not forward bias the EA, which would lead to slower response and additional distortion. For low optical input power levels, this applied voltage may be chosen to be lower, or even 0 V. If the applied voltage in this PAM-4 state is 0 V, one programmable voltage source 250 may be eliminated. In the embodiment of FIG. 3 this programmable voltage source is replaced with a fixed voltage generated by a diode connected n-type metal oxide semiconductor field effect transistor (MOSFET) (or "nFET").

The schematic diagram of FIG. 3 provides further detail regarding the implementation of the circuit of FIG. 2, in some embodiments. FIG. 3 shows a circuit for driving an optical modulator to produce a four-level pulse amplitude modulation (PAM-4) signal. The circuit includes a voltage regulator block 110, a preamplifier block 115, a level shift circuit 120, an amplifier block 125, a selection logic block 130, a switch driver block 135, and a switch ladder block 140. The switch driver block 135, or the combination of the switch driver block 135 and one or more of the preceding stages (i.e., one or more of the selection logic block 130, the amplifier block 125, the level shift circuit 120, and the preamplifier block 115), may be referred to as a "transistor drive circuit". Also shown is an EA 150. The circuit for driving the optical modulator may be implemented in a CMOS integrated circuit. The switch ladder block 140 includes a lower switch ladder (or "anode ladder"), connected (through a first output conductor or "terminal" of the modulator drive circuit) to the anode of the modulator, and an upper switch ladder (or "cathode ladder"), connected (through a second output terminal of the modulator drive circuit) to the cathode of the modulator. The upper switch ladder may operate between approximately 1.27 V and 2.23 V, and the lower switch ladder may operate between approximately 0 V and 0.96 V. These voltages may be trimmed.

The selection logic block 130 converts the input signal, which may be two-bit Gray code (taking values of 00, 01, 11, and 10 for the four PAM-4 levels) or binary code, to ten control signals, each of which is amplified by a cascaded pair of amplifiers in the switch driver block 135 and fed to the control input of a respective switch 260 in the switch ladder block 140. Supply voltages are represented in FIG. 3 with the symbol vXX where the value of the supply voltage is approximately X.X volts (e.g., the value of v21 is approximately 2.1 V, or, more precisely, 2.23 V, as illustrated in FIG. 2, and described above). As such, when the first switch 260 (counting from the top) of the upper switch ladder is turned on (i.e., when the Gray code input value is 10), it feeds a voltage of approximately 2.1 V to the cathode of the modulator (a node identified, in FIG. 3, by the symbol "vc"). The voltage v00 may also be referred to as "vss". A transistor terminal that is connected to a voltage supply may be referred to herein for brevity as being "connected to a reference voltage". For example, if a first terminal (of a first transistor) is connected to a supply voltage of 1.8 V, and a second terminal (of a second transistor) is connected to a supply voltage of 2.1 V, the connections may be described, using the terminology adopted herein, as "the first terminal being connected to a first reference voltage" and "the second terminal being connected to a second reference voltage exceeding the first reference voltage by 0.3 V". Each of the gates (of the selection logic block 130) and amplifiers (of the driver block 135) that generate drive signals for the transistors of the upper switch ladder may be powered by v21 and v12, and each of the gates and amplifiers that generate drive signals for the transistors of the lower switch ladder may be powered by v09 and v00.

In some embodiment each of the switches 260 is a switching MOSFET, with the polarity of each MOSFET (whether it is a p-type MOSFET (a pMOS transistor) or an n-type MOSFET (an nMOS transistor)) being indicated in FIG. 3 by a "p" or an "n" in the symbol for the respective switch. In such an embodiment, the second MOSFET (counting from the top), could have, when turned on (i.e., when the Gray code input value is 11), a gate-source voltage ranging from about 0.4 V to 0.6 V, which may result in a relatively high channel resistance, and which, combined with the nonlinear characteristics of the modulator, may provide insufficient current to drive the modulator to the PAM-4 level corresponding to the Gray code value of 11. Accordingly, a first "helper" transistor (an additional nMOS transistor, the third MOSFET, counting from the top) is connected in parallel with the second pMOS transistor, to allow additional current to flow in this state. A similar situation exists for the second nFET from the bottom of the lower ladder, and consequently a helper p-type MOSFET (pFET) is added in parallel there. In some embodiments, each helper transistor has the opposite polarity to that of the transistor that it helps (i.e., with which it is connected in parallel), as illustrated in FIG. 3. In other embodiments the helper transistor instead has the same polarity as that of the transistor that it helps (e.g., the helper transistor for the second pMOS transistor may be a pMOS transistor). The use of a helper transistor having the opposite polarity to that of the transistor that it helps may allow the circuit to perform well over a larger range of the voltages that may be chosen (e.g., by trimming) for v18 and v03. When the two-bit Gray code is 01, the transistor which is turned on in the upper switch ladder (the fourth MOSFET, counting from the top) typically has greater Vgs than in the case mentioned above, and also because of the nonlinear characteristics of the modulator, current flow is adequate in this state. The transistor in the lower switch ladder which is turned on for the same Gray code (01), i.e., the fourth transistor from the bottom, is in a similar situation, and also does not require a helper transistor. The amplifier block 125, the selection logic block 130, and the switch driver block 135 may together correspond to the upper logic and switch drive circuit 230 and the lower logic and switch drive circuit 240 of FIG. 2.

In some embodiments, each of the amplifiers of the amplifier block 125 produces a differential output signal, i.e., an output signal consisting of a digital signal and its complement. Each of the gates of the selection logic block 130 has two inputs, a first input connected to a signal (or a complementary signal) originating at the most significant bit (MSB) input and a second input connected to a signal (or a complementary signal) originating at the least significant bit (LSB) input. As a result, each of these gates determines whether or not a particular one of the four possible Gray codes is present at the circuit input (at the left side of FIG. 3). Each gate is paired with another gate. For example, the output of each AND gate in the selection logic block 130 is connected to the output of a NOR gate, and the output of each NAND gate in the selection logic block 130 is connected to the output of an OR gate. Because of their respective connections back to the circuit input, within each such pair of gates the two outputs settle to the same value between transitions. The delay characteristics of the two gates of each pair may differ slightly, however, and their outputs being together as shown may therefore result in more symmetric transitions and in an increase in the maximum data rate at which the circuit is capable of operating.

The lower portions of the selection logic block 130, the switch driver block 135, and the switch ladder block 140 operate in a manner analogous to that of the respective corresponding upper portions. The lower switch ladder drives the anode of the modulator (a node identified, in FIG. 3, by the symbol "va"). As mentioned above, as is the case for the upper switch ladder, the lower switch ladder includes a helper transistor to increase the current supplied to the modulator when the two-bit Gray code input signal has a value of 11.

Although in some embodiments MOSFETs are used as the switches 260, in other embodiments other switching elements, e.g., bipolar transistors, may be used instead. As used herein, an "output terminal" of a field effect transistor (FET) (such as a MOSFET) refers to the source or the drain, and the "control terminal" of the FET refers to the gate. Similarly for other kinds of transistors the principal current carrying terminals may be referred to as "output terminals" and a third terminal employed to control the current flow may be referred to as the "control terminal". Although the detailed embodiments shown relate to PAM-4 modulation, analogous circuits may readily be constructed for other types of modulation, e.g., PAM-8 modulation.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a driver for an optical modulator have been specifically described and illustrated herein, many modifications and variations will be apparent to those skilled in the art. Accordingly, it is to be understood that a driver for an optical modulator constructed according to principles of this invention may be embodied other than as specifically described herein. The invention is also defined in the following claims, and equivalents thereof

What is claimed is:

1. A modulator drive circuit, comprising:
a first plurality of transistors;
a second plurality of transistors; and
a transistor drive circuit,
each of the first plurality of transistors having:
   a first output terminal connected to a respective reference voltage,
   a second output terminal connected to a first output terminal of the modulator drive circuit, and
   a control terminal connected to the transistor drive circuit;
each of the second plurality of transistors having:
   a first output terminal connected to a respective reference voltage,
   a second output terminal connected to a second output terminal of the modulator drive circuit, and
   a control terminal connected to the transistor drive circuit;
the transistor drive circuit being configured to operate at any time in one of a plurality of states, and, in any state of the plurality of states:
   to turn on:
      one of the first plurality of transistors, and
      one of the second plurality of transistors; and
   to turn off:
      the remainder of the transistors of the first plurality of transistors, and
      the remainder of the transistors of the second plurality of transistors,
further comprising a helper transistor having:
   a first output terminal connected to the first output terminal of a first transistor of the first plurality of transistors,
   a second output terminal connected to the second output terminal of the first transistor, and
   a control terminal connected to the transistor drive circuit,
wherein the transistor drive circuit is further configured:
   in any state of the transistor drive circuit in which the first transistor is turned on, to turn on the helper transistor; and
   in any state of the transistor drive circuit in which the first transistor is turned off, to turn off the helper transistor.

2. The modulator drive circuit of claim 1, wherein the helper transistor has a polarity opposite to that of the first transistor.

3. A modulator drive circuit, comprising:
a first plurality of transistors;
a second plurality of transistors; and
a transistor drive circuit,
each of the first plurality of transistors having:
   a first output terminal connected to a respective reference voltage,
   a second output terminal connected to a first output terminal of the modulator drive circuit, and
   a control terminal connected to the transistor drive circuit;
each of the second plurality of transistors having:
   a first output terminal connected to a respective reference voltage,
   a second output terminal connected to a second output terminal of the modulator drive circuit, and
   a control terminal connected to the transistor drive circuit;
the transistor drive circuit being configured to operate at any time in one of a plurality of states, and, in any state of the plurality of states:
   to turn on:
      one of the first plurality of transistors, and
      one of the second plurality of transistors; and
   to turn off:
      the remainder of the transistors of the first plurality of transistors, and
      the remainder of the transistors of the second plurality of transistors,
wherein:
   the first plurality of transistors comprises four transistors,
   the second plurality of transistors comprises four transistors, and
   the modulator drive circuit is configured to effect PAM-4 modulation with an electro-absorption modulator.

4. The modulator drive circuit of claim 3, wherein:
each of the first plurality of transistors is a metal oxide semiconductor field effect transistor (MOSFET), and
each of the second plurality of transistors is a MOSFET.

5. The modulator drive circuit of claim 4, wherein:
the first output terminal of a first transistor of the first plurality of transistors is connected to a first reference voltage,
the first output terminal of a second transistor of the first plurality of transistors is connected to a second reference voltage, greater than the first reference voltage, the first output terminal of a third transistor of the first plurality of transistors is connected to a third reference voltage, greater than the second reference voltage, the first output terminal of a fourth transistor of the first plurality of transistors is connected to a fourth reference voltage, greater than the third reference voltage, the first output terminal of a first transistor of the second plurality of transistors is connected to a fifth reference voltage, greater than or equal to the fourth reference voltage, the first output terminal of a second transistor of the second plurality of transistors is connected to a sixth reference voltage, greater than the fifth reference voltage, the first output terminal of a third transistor of the second plurality of transistors is connected to a seventh reference voltage, greater than the sixth reference voltage, the first output terminal of a fourth transistor of the second plurality of transistors is connected to an eighth reference voltage, greater than the seventh reference voltage.

6. A system, comprising:
the modulator drive circuit of claim 5, and
an electro-absorption modulator connected to the first and second output terminals of the modulator drive circuit,
wherein the fifth reference voltage exceeds the fourth reference voltage by at least 250 mV.

7. The modulator drive circuit of claim 5, wherein:
the first transistor of the first plurality of transistors is an n-type MOSFET,
the second transistor of the first plurality of transistors is an n-type MOSFET,
the third transistor of the first plurality of transistors is a p-type MOSFET,
the fourth transistor of the first plurality of transistors is a p-type MOSFET,
the first transistor of the second plurality of transistors is an n-type MOSFET,
the second transistor of the second plurality of transistors is an n-type MOSFET,
the third transistor of the second plurality of transistors is a p-type MOSFET, and
the fourth transistor of the second plurality of transistors is a p-type MOSFET.

8. The modulator drive circuit of claim 5, wherein each of:
the second reference voltage,
the third reference voltage,
the fourth reference voltage,
the fifth reference voltage,
the sixth reference voltage,
the seventh reference voltage, and
the eighth reference voltage,
exceeds a respective one of:
the first reference voltage,
the second reference voltage,
the third reference voltage,
the fourth reference voltage,
the fifth reference voltage,
the sixth reference voltage, and
the seventh reference voltage,
by an amount greater than 0.2 V and less than 0.5 V.

9. A modulator drive circuit, comprising:
a first plurality of transistors;
a second plurality of transistors; and
a transistor drive circuit,
each of the first plurality of transistors having:

a first output terminal connected to a respective reference voltage,
a second output terminal connected to a first output terminal of the modulator drive circuit, and
a control terminal connected to the transistor drive circuit;
each of the second plurality of transistors having:
a first output terminal connected to a respective reference voltage,
a second output terminal connected to a second output terminal of the modulator drive circuit, and
a control terminal connected to the transistor drive circuit;
the transistor drive circuit being configured to operate at any time in one of a plurality of states, and, in any state of the plurality of states:
to turn on:
one of the first plurality of transistors, and
one of the second plurality of transistors; and
to turn off:
the remainder of the transistors of the first plurality of transistors, and
the remainder of the transistors of the second plurality of transistors,
wherein a transistor of the second plurality of transistors is in a deep n-well in an integrated circuit.

10. A modulator drive circuit, comprising:
a first plurality of transistors;
a second plurality of transistors; and
a transistor drive circuit,
each of the first plurality of transistors having:
a first output terminal connected to a respective reference voltage,
a second output terminal connected to a first output terminal of the modulator drive circuit, and
a control terminal connected to the transistor drive circuit;
each of the second plurality of transistors having:
a first output terminal connected to a respective reference voltage,
a second output terminal connected to a second output terminal of the modulator drive circuit, and
a control terminal connected to the transistor drive circuit;
the transistor drive circuit being configured to operate at any time in one of a plurality of states, and, in any state of the plurality of states:
to turn on:
one of the first plurality of transistors, and
one of the second plurality of transistors; and
to turn off:
the remainder of the transistors of the first plurality of transistors, and
the remainder of the transistors of the second plurality of transistors,
further comprising an input configured to receive an input value consisting of two bits, wherein the modulator drive circuit is configured to produce an output voltage, between the first output terminal of the modulator drive circuit and the second output terminal of the modulator drive circuit, the output voltage being:
a first voltage when the input value is 10,
a second voltage, greater than the first voltage, when the input value is 11,
a third voltage, greater than the second voltage, when the input value is 01, a fourth voltage, greater than the third voltage, when the input value is 00.

11. The modulator drive circuit of claim 10, further comprising a selection logic circuit for generating, based on the input value, control signals for the first plurality of transistors, the selection logic circuit comprising:
 an AND gate having two inputs, and an output; and
 a NOR gate having two inputs, and an output connected to the output of the AND gate.

* * * * *